(12) United States Patent
Peter et al.

(10) Patent No.: US 12,007,229 B2
(45) Date of Patent: Jun. 11, 2024

(54) SENSOR FOR DETECTING AN OBJECT AND METHOD OF EVALUATING A SENSOR SIGNAL

(71) Applicant: SICK AG, Waldkirch (DE)

(72) Inventors: Andreas Peter, Waldkirch (DE); Sascha Thoss, Waldkirch (DE); Olaf Machul, Waldkirch (DE)

(73) Assignee: SICK AG, Waldkirch (DE)

( * ) Notice: Subject to any disclaimer, the term of this patent is extended or adjusted under 35 U.S.C. 154(b) by 324 days.

(21) Appl. No.: 17/470,598

(22) Filed: Sep. 9, 2021

(65) Prior Publication Data

US 2022/0074729 A1    Mar. 10, 2022

(30) Foreign Application Priority Data

Sep. 10, 2020    (EP) .................................... 20195414

(51) Int. Cl.
| | | |
|---|---|---|
| *G01B 7/02* | (2006.01) | |
| *G06N 20/10* | (2019.01) | |
| *H03K 17/95* | (2006.01) | |

(52) U.S. Cl.
CPC ............. *G01B 7/023* (2013.01); *G06N 20/10* (2019.01); *H03K 17/952* (2013.01)

(58) Field of Classification Search
None
See application file for complete search history.

(56) References Cited

U.S. PATENT DOCUMENTS

| | | | |
|---|---|---|---|
| 11,573,100 B2 * | 2/2023 | Peter | G06N 3/045 |
| 2012/0043970 A1 | 2/2012 | Olson | |
| 2019/0049581 A1 * | 2/2019 | Waslowski | G01S 7/481 |
| 2021/0164808 A1 * | 6/2021 | Peter | G06N 3/045 |

FOREIGN PATENT DOCUMENTS

| | | | |
|---|---|---|---|
| DE | 4433772 A1 | 3/1996 | |
| DE | 102006053023 B4 | 8/2007 | |
| DE | 102007027822 A1 | 12/2008 | |
| DE | 102007045118 A1 | 4/2009 | |
| DE | 102017109813 A1 | 11/2018 | |
| DE | 102018102898 A1 | 11/2018 | |
| EP | 3282586 A1 * | 2/2018 | G01B 7/023 |
| EP | 3282586 A1 | 2/2018 | |
| EP | 3829064 A1 | 6/2021 | |
| JP | 2015-533273 A | 11/2015 | |
| JP | 2019-40595 A | 3/2019 | |

(Continued)

OTHER PUBLICATIONS

English Translation of EP3282586A1. (Year: 2018).*

(Continued)

*Primary Examiner* — Jermele M Hollington
(74) *Attorney, Agent, or Firm* — Nath, Goldberg & Meyer; Jerald L. Meyer

(57) ABSTRACT

A sensor for detecting an object is provided that has a detection unit for detecting a sensor signal and a control and evaluation unit that is configured to determine an object property by evaluating the sensor signal, to determine a correction value for interference of the sensor environment from the sensor signal using a method of machine learning, and to take the correction value into account in the determination of the object property.

26 Claims, 6 Drawing Sheets

(56) References Cited

FOREIGN PATENT DOCUMENTS

| | | |
|---|---|---|
| JP | 2020-22091 A | 2/2020 |
| WO | 2014146623 A1 | 9/2014 |

OTHER PUBLICATIONS

European Search Report dated Feb. 17, 2021 for application No. EP20195414.6.

European Examination Report dated Jun. 1, 2021 for application No. EP20195414.6.

"Capsule Neural Network Based Height Classification Using Low-Cost Automobile Ultrasonic Sensors" Maximilian Pöpperli, et al., 2019 IEEE Intelligent Vehicles Symposium (IV) Paris, France, Jun. 9-12, 2019.

"Compensation of Measurement Errors for a Magnetoresistive Angular Sensor Array Using Artificial Neuronal Networks" Phil Meyer (Member IEEE), et al., Faculty of Electrical Engineering, Ostfalia University of Applied Sciences vol. 8, 2020.

"Artificial neural network assisted compact inductive distance sensor" Zoltän Käntor, et al., 30th Eurosensors Conference, EUROSENSORS 2016. Procedia Engineering 168 ( 2016 ) 23-26.

\* cited by examiner

SENSOR FOR DETECTING AN OBJECT AND METHOD OF EVALUATING A SENSOR SIGNAL

FIELD

The invention relates to a sensor for detecting an object and to a method for evaluating a sensor signal.

BACKGROUND

Sensors, for example inductive proximity sensors acting as contactless switches are frequently used in a rough environment. An important quality feature in this respect is the maximum achievable switching distance. A large switching distance has even further advantages in addition to the obvious advantage that an object can already be detected at larger distances. The greater the switching distance of the sensor, the greater the potential distance from the object to be detected can be. The likelihood of mechanical destruction is thereby reduced. A further advantage of large switching distances is the larger installation tolerance. An engineer thereby does not have to work so precisely in the assembly of the sensor, which can save time and money and can increase the availability of the system. A detection job can be achieved with a smaller sensor under certain circumstances, which frequently has advantages in construction when a greater switching distance can be achieved with a specific sensor diameter.

A further important quality feature of inductive proximity sensors, in addition to the nominal switching distance Sn defined for steel, is also the size of the real switching distance that is achieved with other materials. These switching distances are characterized by so-called reduction factors. The sensor ideally has the same large switching distance for any desired metals. The reduction factors in this case have the maximum value 1 and are therefore called F1 (factor 1) sensors.

A third important property that influences the switching distance of the sensor is its sensitivity to the installation. The ideal aimed for here would be a sensor that is completely insensitive to its installation depth and to the installation material and always maintains its specified switching distance. In reality, however, there is an installation dependency whose effect is called an installation jump.

Inductive proximity sensors are available, for example those having plastic caps, that achieve four times the value of a standard nominal switching distance at least with some construction shapes. They are sensors that work according to the classical quality process. The disadvantage of these sensors is that they do not have an F1 behavior. Since only the amplitude of a sine oscillation at one frequency is generally available as information with these sensors, this disadvantage can also not be remedied by intelligent algorithms.

Some inductive proximity sensors work with a pulse process instead of a sine oscillation. A pulse can be seen as a mixture of sine signals of different frequencies, amplitudes and phasings and thus deliver additional information. Such sensors can practically demonstrate F1 behavior at least with steel and aluminum, but still have a relatively high installation dependency.

There are approaches to minimize the installation jump by additional measures such as films that are wound around the core set or by additional compensation coils. The sensitivity with respect to the installation situation is thereby reduced, but a perfect compensation of the installation jump is not possible. Such hardware measures moreover have a negative effect on the switching distance and increase the production costs.

Some examples from the prior art will be named here. An inductive proximity switch is known from DE 10 2006 053 023 B4 that has a main transmission coil and a compensation coil coaxially surrounding it and having an opposite winding. DE 10 2007 027 822 A1 deals with an inductively operating sensor arrangement having a measurement coil and a further coil. DE 10 2007 046 18 A1 describes an inductive proximity switch and a core coil for it with which at least two sensor coils are associated for detecting partial flows. A primary coil and a compensation coil having a separately controllable power source is provided in an inductive proximity switch in DE 10 2017 109 813 A1. DE 10 2018 102 898 A1 discloses a proximity sensor having a plurality of coils and extracts a first component that is caused by an assembly fitting and a second component that is caused by the detection object from the detection results of a reception circuit at the two coils, with the second component then being compensated using the first component.

Practically all of the proximity sensors currently used in the field work with classical evaluation processes, either the quality process with the sine oscillation of a frequency or the pulse process. There have also been first approaches of an evaluation by processes of machine learning in the meantime. The digitization of the pulse response in accordance with EP 3 282 586 B1 can be seen as a requirement for this, even though it is not brought into any relationship with machine learning there. The total spectrum of methods of digital signal processing thereby becomes accessible.

The still unpublished European patent application having the reference number 19 212 336.2 describes an inductive proximity sensor that preprocesses a sensor signal with a reference signal to form an intermediate signal. The output value of the sensor is then determined from the intermediate signal using an evaluation unit trained in accordance with a machine learning process.

WO2014/146623A1 deals with an inductive displacement measuring sensor and a method of operating the latter. The pulse response is directly evaluated by an artificial neural network. This has to be trained individually for every sensor with a huge effort. Since the pulse response is directly evaluated and no intelligent preprocessing is suggested in WO2014/146623A1, tolerance differences between a plurality of sensors of the same type can also not be eliminated so that it would not be possible to dispense with the individual training. If a response should also have to be made to different installation situations, which is not discussed at all here, the anyway already unmanageable training effort for every single sensor would also be multiplied even more.

A sensor arrangement is known from DE 44 33 872 A1 whose evaluation unit has a neural network in which the link weights are determined and stored in a learning phase between its layers. The measurement signals here are also used directly for learning and for evaluating. Training is performed for different materials, but not for different installation situations.

The paper by Kántor, Zoltán, and Zoltán Pólik. "Artificial neural network assisted compact inductive distance sensor." Procedia Engineering 168 (2016): 23-26 describes a material-independent, compact inductive distance sensor. The signals are also evaluated using an artificial neural network here that has to be trained individually per sensor. The disadvantages of the use of non-preprocessed signals, of a huge training effort that cannot be made in mass production, and of a further existing sensitivity for the specific installation situation that have now been described multiple times have not been addressed.

SUMMARY

It is therefore the object of the invention to improve the evaluation of a sensor signal, in particular of an inductive proximity sensor.

This object is satisfied by a sensor for detecting an object and by a method of evaluating a sensor signal in accordance with the respective independent claim. The sensor, in particular an inductive proximity sensor, detects a sensor signal with a detection unit. A control and evaluation unit determines an object property by evaluating the sensor signal. This evaluation preferably takes place using classical means, that is without a method of machine learning.

The invention starts from the basic idea of evaluating the sensor signal or parts of the sensor signal once again using a method of machine learning. The aim of this evaluation is to determine a correction value for interference of the sensor environment that is taken into account in the evaluation of the sensor signal for determining the object property or that corrects the object property. An estimate of the interfering environmental influences is accordingly carried out by a method of machine learning. A preferred implementation divides the evaluation into a main path using a classical method for acquiring the object property and a correction path using a method of machine learning. In this process, the classical method can evaluate the sensor signal very fast with a simple signal processing and the method of machine learning can also be complex and take place more slowly.

The invention has the advantage that the three core properties of an inductive proximity sensor discussed in the introduction, that is a greater switching distance, F1 behavior, and small installation dependency, can be combined in one unit or at least one of these core properties is optimized. An at least fourfold switching distance and simultaneously an F1 behavior for at least aluminum and steel can be achieved with the sensor concept in accordance with the invention. These properties remain largely independent of the installation depth and the installation material. A method of machine learning generally makes it possible to recognize the target material of the detected object with which a direct recognition of, for example, only ferromagnetic materials while excluding nonferrous metals is possible in addition to a material-independent switching point, that is, F1 behavior. In accordance with the invention, a type-specific training is sufficient for a whole class of sensors; a sensor-individual training is not necessary.

The detection unit preferably has at least one coil. An inductive proximity sensor detects its sensor signal therewith. The detection unit even more preferably has exactly one coil.

The sensor has at least one coil for generating a pulse signal. The coil is in particular fed with a transmission current pulse that in turn induces a voltage pulse as a sensor signal for this purpose. This is also called a pulse response. Considerably more information can be acquired from the pulse response using a method of machine learning than, for example, only from an integral value. The transmitting coil can be identical to the receiving coil in an embodiment. In another embodiment, at least one first coil is present for transmission and a second coil of the reception unit is present, preferably exactly one second coil of the reception unit.

The sensor preferably has an additional element to vary properties of the detection unit or of a generated pulse signal and thus to detect additional information on the sensor environment. The sensor signal acquired by supporting the additional element is also called an additional signal for distinguishing purposes. A sensor signal, however, thus likewise remains that can be evaluated in the same manner, with the sensor signal tending more to contain information of the source measurement result and the additional signal information on interference. This separation is, however, not clear-cut; both the sensor signal and the additional signal can contribute both to the determination of the object information and to the correction value depending on the embodiment. The additional element supports the estimate of the correction value because the sensor learns more about the installation situation. Additional measurements are carried out by the additional element or the measurement conditions are varied. The method of machine learning is preferably confronted with this additional information during training. Interference of the environment can thus be masked with the aid of the correction value to obtain a high switching distance uniformly in all installation situations.

The additional element is preferably a vertical coil, a coaxial coil, or a short circuit ring. A separate pulse transmission that produces a further sensor signal preferably takes place using a separate vertical coil or a separate coaxial coil. In a particularly preferred embodiment, the pulse transmission takes place via the single reception coil, on the one hand, and via the additional vertical coil or coaxial coil, on the other hand. Additional information can also be acquired by a selective engagement of a short circuit ring.

The control and evaluation unit is preferably configured to determine a binary object determination signal as an object property, with the sensor in particular having a switching output to output the object determination signal as a switching signal. The object property in this case is a piece of binary presence information "object there/object not there", with the presence being able to be subject to determined conditions such as a predefined distance or a specific material. The sensor preferably acts as a switch that switches its switching output over in accordance with the binary object determination signal, in each case on an entry or exit of an object.

An A/D converter is preferably associated with the detection unit for digitizing the sensor signal. The sensor signal can then be digitally further processed. A portion of the sensor signal since the application of the transmission current pulse up to the decaying of the induced voltage pulse is, for example, digitized. The digitized sensor signal can be simply further processed, on the one hand, for example by formation of an integral value, and a method of machine learning can, on the other hand, offset and combine the scanning values with one another practically as desired and thus acquire very much more information from a pulse.

The control and evaluation unit is preferably configured to generate an intermediate signal from a reference signal and the sensor signal and to determine the object property and/or the correction value using the intermediate signal. The intermediate signal is then further processed; this is still an evaluation of the sensor signal as an original input value. The reference signal is preferably a previously recorded and stored separate sensor signal of the sensor or a sensor signal of a reference sensor. The separate sensor signal, in particular a separate reference pulse, is sensor-specifically or sensor-individually recorded and stored, for example on production. Such a step, for example during final inspection, is not time consuming, in contrast to an individual training for a method of machine learning. It is alternatively conceivable to use a sensor signal of a reference sensor, that is preferably of the same design or of the same type, as the reference signal. The recording of a reference signal per individual sensor is thus not necessary. It is also conceivable that a plurality of reference signals are stored for different application situations between which a choice is made by parameterization or that are used in a multiple evaluation.

The control and evaluation unit is preferably configured to generate a feature vector from the sensor signal, in particular after a transformation and/or dimension reduction. The feature vector corresponds to a preprocessing of the sensor signal and is preferably used by the method of machine learning for determining the correction value. The feature vector can likewise be used for the classical method for the evaluation, but the sensor signal or the digitized sensor signal is preferably processed here. The transformation is, for example, a Fourier transform, a wavelet transform, a Hadamard transform, a discrete cosine transform, or a principle component analysis (PCA). The essential information can frequently be detected better in the transform. A dimension reduction can thus be carried out in which the large number of sampling points are reduced to the essential features. These features are, for example, found via a threshold in the transform. The feature vector can also be produced from a plurality of pulse responses.

The control and evaluation unit is preferably configured to integrate the sensor signal, in particular to compare the integrated sensor signal with a threshold value. This relates to the method of determining the object property by classical means or the main path, not to the method of machine learning to locate the correction value. Depending on the embodiment, it is not the raw sensor signal, but rather a preprocessing result thereof that is integrated. The integral value is then preferably compared with a threshold value to derive a binary object determination signal or a switching signal.

The correction value is preferably a correction value for the integrated sensor signal. The method of machine learning in this embodiment determines a correction value that corrects the integral in accordance with the specific sensor environment and installation situation.

The control and evaluation unit is preferably configured for at least one of the following methods of machine learning: a linear model, a decision tree, a neural network, a Gaussian process regression, a k-nearest neighbor process, or a support vector machine. The matching method of machine learning can be selected with reference to the available evaluation resources, training data, and requirements of the possible applications and installation situations.

The method of machine learning is preferably trained using sensor signals in different sensor environments, in particular while varying the installation depth, installation material, object distance, and object material. Important influences of the sensor environment are thereby taken into account in the method of machine learning and the thus determined correction value; in other words, how the installation situation influences the different detection situations is mapped. This training does not have to be performed for every single sensor, but can take place for a whole class of sensors. The method of machine learning can cope with tolerances of individual sensors and it is moreover possible to at least reduce the tolerances with the aid of an individual reference signal.

The control and evaluation unit is preferably configured to track the correction value over time and to adapt it with reference to its history, in particular with a prediction filter. The installation situation and the other sensor environment is typically very stable. Correction values determined in the past are therefore still at least a good estimate. Still present dynamics can therefore be easily detected via a prediction filter. In the simplest case, only a mean value or a running mean is formed; more complex prediction filters such as a Kalman filter or a Wiener filter are also possible.

In the method in accordance with the invention, a sensor signal of a sensor in accordance with the invention is preferably evaluated as the sensor signal. The method of machine learning is preferably trained in advance with sensor signals in different sensor environments. At least one of the values of installation depth, installation material, object distance, and object material is particularly preferably varied here. All too many training situations thus do not have to be made and the essential influences are nevertheless detected.

The method in accordance with the invention can be further developed in a similar manner and shows similar advantages in so doing. Such advantageous features are described in an exemplary, but not exclusive manner in the subordinate claims dependent on the independent claims.

BRIEF DESCRIPTION OF THE DRAWINGS

The invention will be explained in more detail in the following also with respect to further features and advantages by way of example with reference to embodiments and to the enclosed drawing. The Figures of the drawing show in.

DETAILED DESCRIPTION

Figure 1:
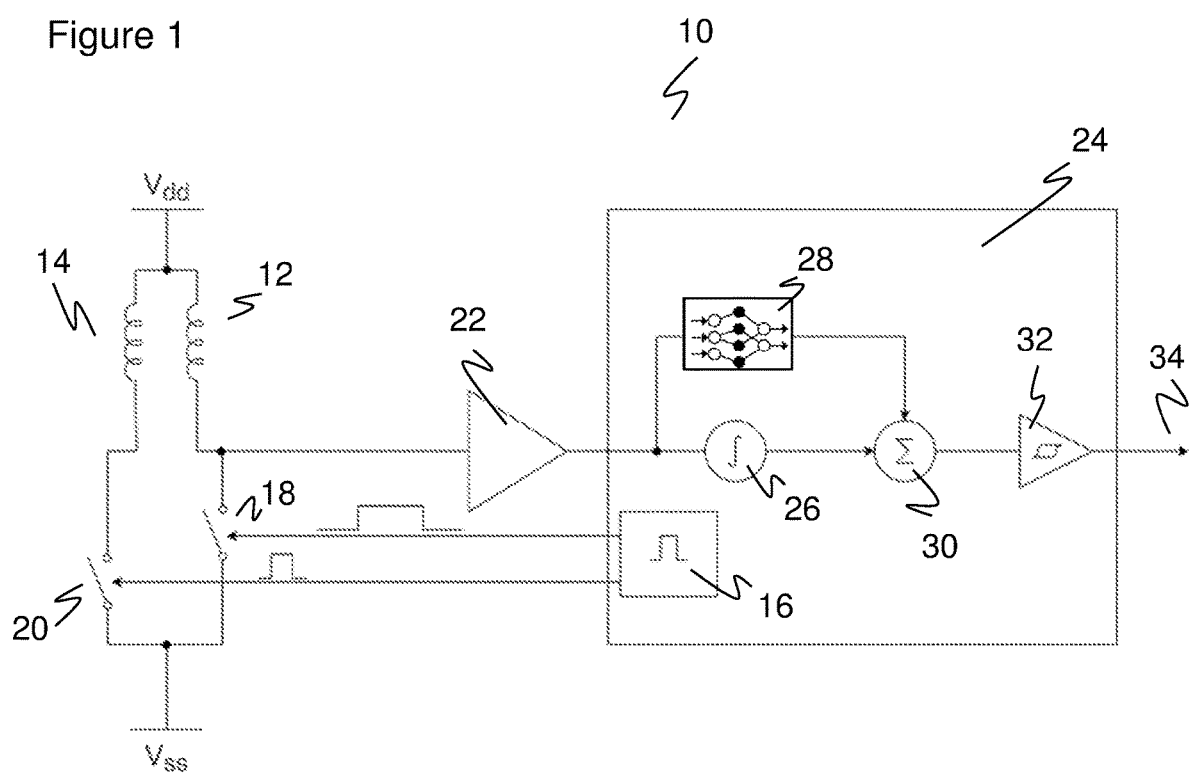
FIG. 1 a representation of the exemplary design of a sensor in accordance with the invention.

FIG. 1 shows by way of example the design of a sensor 10 in an embodiment of the invention. The sensor 10 comprises a transmission and reception coil 12 and an additional coil 14. The two coils 12, 14 can be controlled by a coil control 16 via a first switch 18 or a second switch 20 using a transmission pulse. A sensor signal thereby induced in the transmission and reception coil 12 is supplied to a readout amplifier and A/D converter 22 and is digitized there. The further digital processing preferably takes place in software, for example on a microcontroller, a digital signal processor, a digital signal controller—or another processing module that is called a control and evaluation unit 24 overall and can also comprise the coil control 16.

In one non-limiting configuration, the control and evaluation unit is configured to generate a feature vector from the sensor signal. In another non-limiting configuration, the control and evaluation unit is configured to generate a feature vector from the sensor signal after a transformation and/or dimension reduction.

The digitized sensor signal is evaluated on a divided path, in a main path on the one hand using a classical process that is represented by an integration unit 26 by way of example, and, on the other hand, in a correction path using a method of machine learning, with a correction value unit 28 responsible for this being shown purely by way of example as a neural network here. The integral of the integration unit 26 is corrected by a correction value of the correction unit 28 in a combining unit 30. This correction can also be more complex depending on the classical method and the method of machine learning. The corrected integral is compared with a switching threshold in a switching logic 32, preferably while taking account of a hysteresis, and the sensor 10 outputs a corresponding switching signal to one or more switching outputs 34. Other embodiments of the sensor 10 generate a different piece of object information from the sensor signal instead of a switching signal.

Figure 2:
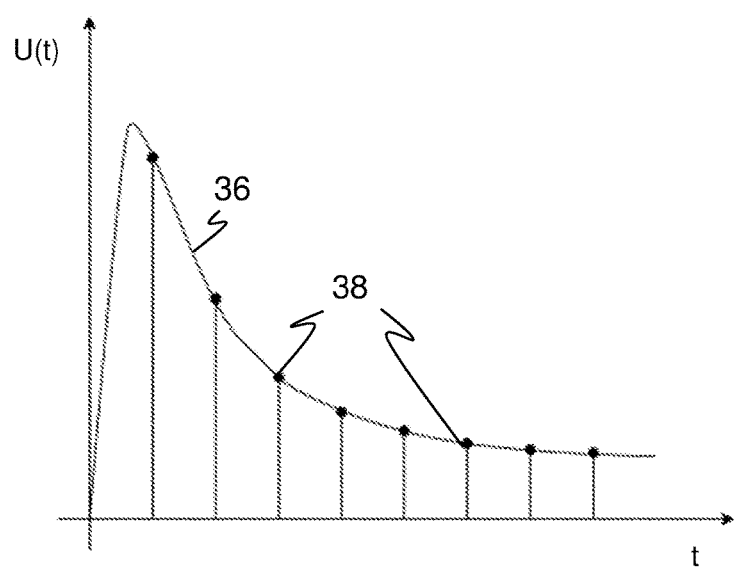
FIG. 2 a representation of an exemplary sensor signal, here a pulse response, with its digitizing.

FIG. 2 shows an exemplary sensor signals 36 of the sensor 10. The sensor 10 preferably works with pulses: A current pulser is triggered in the transmission and reception coil 12 and/or in the additional coil 14 via the switches 18, 20 and a voltage pulse is induced as a pulse response in the transmission and reception coil 12, as is shown by way of example in FIG. 2. The sensor 10 in the preferred embodiment therefore works with two transmission coils and exactly one reception coil, with the transmission and reception coil 12 having a dual function. The sensor signal 36 is sampled at sampling points 38 and is thus digitized.

Figure 3:
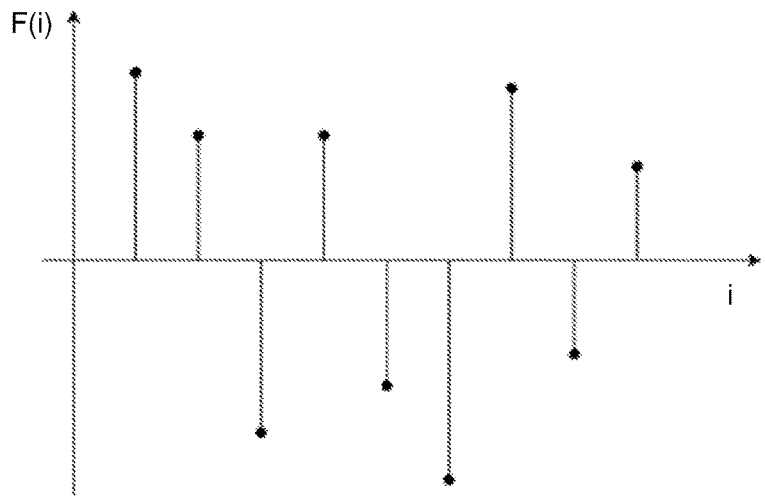
FIG. 3 a representation of an exemplary feature vector from the sensor in accordance with FIG. 2.

FIG. 3 shows a feature vector that is acquired from the digitized sensor signal 36. The relevant information is thereby further compressed or, in other words, a dimension reduction is carried out. The features are preferably not acquired from the sensor signal 36 itself, but rather from a transform thereof. This is will be explained in more detail below for an example with respect to FIGS. 9 to 11.

Figure 4:
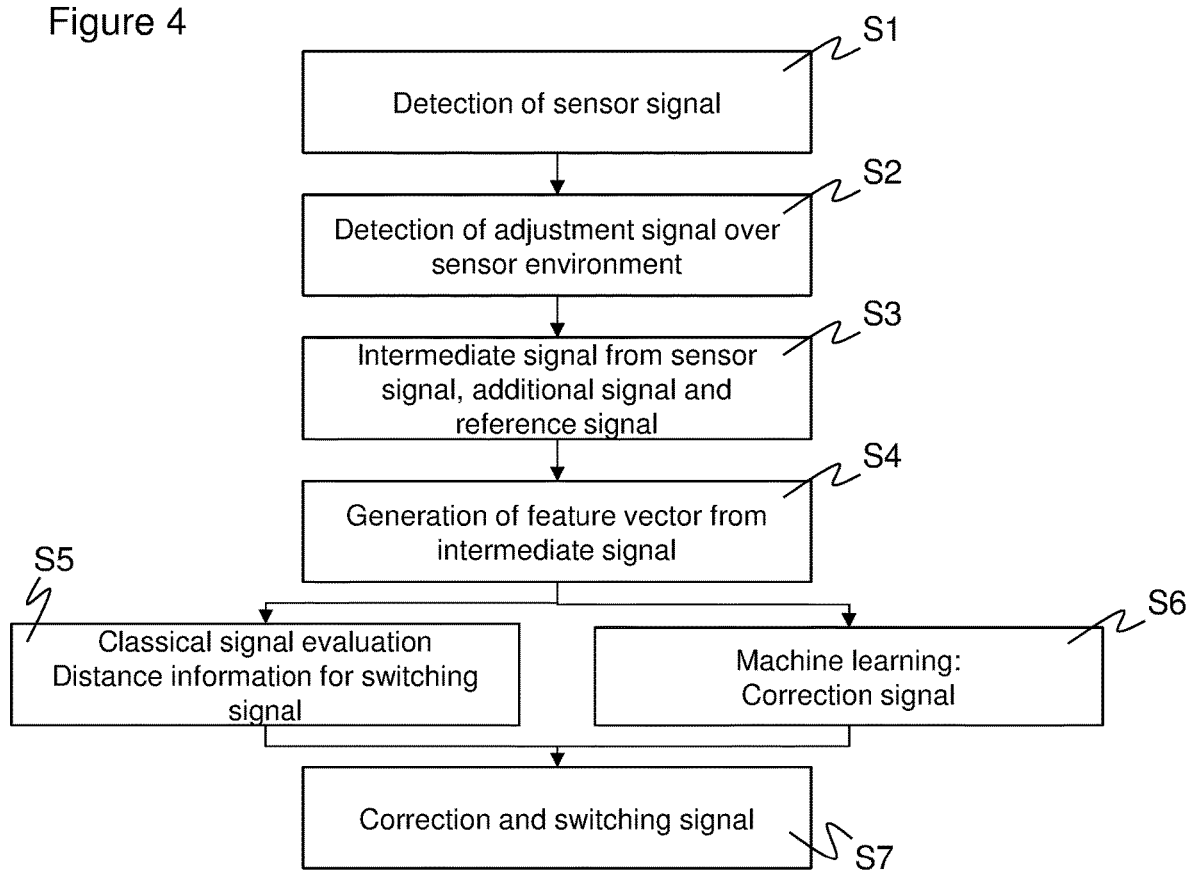
FIG. 4 an exemplary flowchart for determining a switching signal with correction by a method of machine learning.

FIG. 4 shows an exemplary flowchart for the evaluation of a sensor signal with the sensor 10 in accordance with FIG. 1. The routine is described using a pulse-based process, but the invention is also usable for other processes.

In a step S1, a sensor signal is detected in that the transmission and reception coil 12 generates a pulse and the pulse thereby induced in the transmission and reception coil 12 is recorded, amplified, and digitized.

Correspondingly, in a step S2, a further sensor signal called an additional signal is detected to acquire information on the sensor environment in that the additional coil 14 generates a pulse and the pulse thereby induced in the transmission and reception coil 12 is recorded, amplified, and digitized. Depending on the embodiment, the step S2 can be dispensed with or the additional signal can be the pulse response to a pulse simultaneously generated in the transmission and reception coil 12 and in the additional coil 14. It is also conceivable in principle only to evaluate the pulse response to a pulse of the additional pulse 14 in accordance with step S2 and thus to at least partly omit step S1.

In an optional, but very helpful, step S3, an intermediate signal is generated from the sensor signal and a reference signal. If an additional signal was recorded in step S2, an intermediate signal is preferably also generated from the additional signal and a further reference signal for this purpose. The respective intermediate signal then replaces or supplements the original sensor signal or additional signal for the further evaluation. The reference signal is a pulse stored in the sensor 10 beforehand that was preferably acquired for exactly this individual sensor 10 in an environment defined, for example, with respect to installation, installation material, target distance, and target material. Alternatively, it is a reference signal that was determined as representative and more generally for a class of sensors. The compensation with the reference signal works very well by difference formation without thereby precluding more complex compensations. The taking into account of a reference signal is explained more in the still unpublished European patent application with the reference number 19 212 336.2 already named in the introduction.

A feature vector is formed from the intermediate signal in a step S4. A very simple feature vector directly comprises the sampling points. However, this requires an unpleasantly high-dimensional further analysis. The intermediate signal is therefore preferably transformed, for example by a Fourier transform, a wavelet transform, a Hadamard transform, a discrete cosine transform, or a principle component analysis (PCA). Those values can subsequently be located in the transform, for example by a threshold operation, that presumably bear the most relevant information. The feature vector is then assembled from these values.

Steps S3 and S4 are preferably carried out in software in the control and evaluation unit 24. In FIG. 1, a corresponding function block would have to be arranged downstream of the A/D converter 22 and upstream of the integration unit 26 or of the correction value unit 28.

In a step S5, a classical signal evaluation takes place to acquire distance information of a detected object or a switching signal. The sensor signal and/or the additional signal is/are integrated for this purpose, for example. The feature vector from step S4 can be based on the classical signal evaluation. Alternatively, the classical evaluation is based on the sensor signal and/or on the additional signal itself, but with the reference signal in accordance with step S3 preferably being taken into account. This corresponds to the main path having the integrating unit 26 in FIG. 1. Integration is only one example for a classical signal evaluation.

An evaluation using a method of machine learning takes place in a step S6 to acquire a correction value that takes account of the sensor environment and specifically its installation situation. Additional information on the sensor environment is available for the determination of the correction value due to the additional signal. Depending on the sensor 10, the application fields, and conceivable sensor environments, different methods of machine learning are suitable, for example a linear model, a decision tree, a neural network, a Gaussian process regression, a k-nearest neighbor process, or a support vector machine.

The result of the classical signal evaluation is corrected in a step S7 by the correction value that is acquired using a method of machine learning. The correction value is, for example, deducted from the integral and the value corrected in this manner is compared with a switching threshold to acquire a switching signal. In a different classical signal evaluation than via an integral, different correction values and different manners are conceivable to correct the classical signal evaluation by the correction value.

The routine in accordance with FIG. 4 is then cyclically repeated so that the sensor 10 provides a respective current switching signal to its switching output 34.

To be able to better determine the interfering environmental influences, it is advantageous to detect the sensor environment directly through additional measurements. The additional coil 14 is provided for this purpose in FIG. 1. It is, however, only shown symbolically and in its interconnection there. Specific implementation examples for elements for detecting an additional signal are shown in FIGS. 5 to 7.

Figure 5:
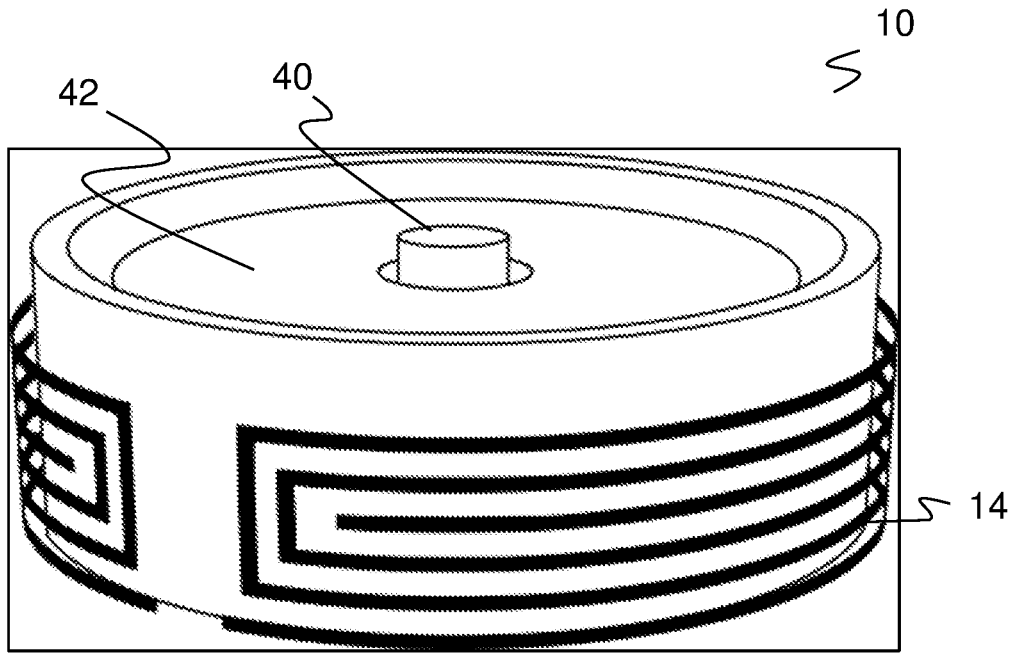
FIG. 5 a three-dimensional view of an additional vertical coil for an improved detection of the sensor environment.

FIG. 5 shows a three-dimensional view of a vertical coil as an additional coil 14. The sensor 10 typically has a cylindrical shape on the whole. A ferrite 40 is shown having a coil 42 that acts as a transmission and reception coil 12. The separate vertical coil 14 excites the environment of the sensor 10 more than the object or target to be detected and thus generates information on the sensor environment.

Figure 6:
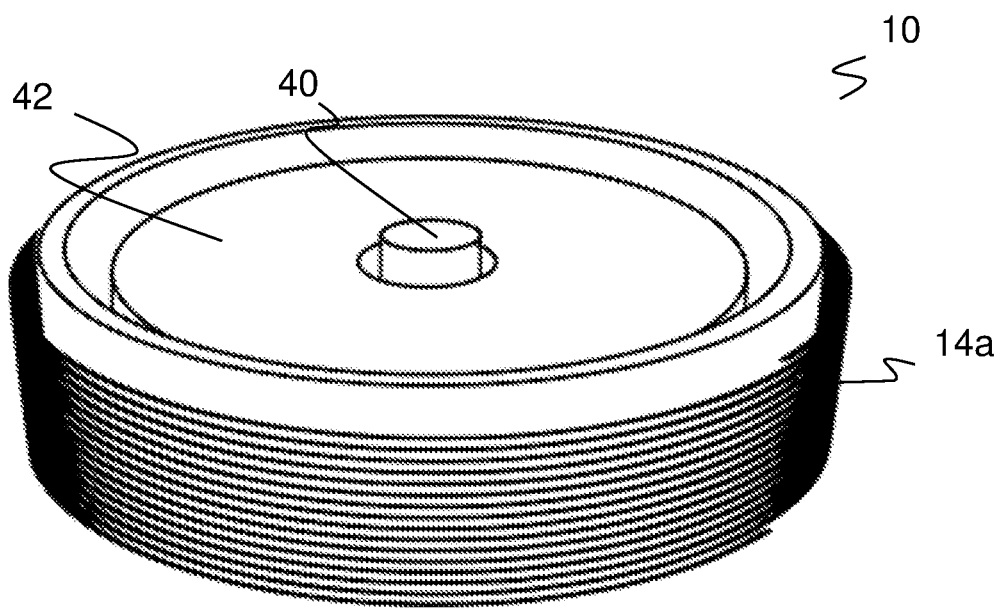
FIG. 6 a three-dimensional view of an additional coaxial coil for an improved detection of the sensor environment.

FIG. 6 shows a three-dimensional view of an additional coil 14a now configured alternatively as a coaxial coil around the core set. The coaxial coil undergoes a different force by the magnetic field of the target and of the installation and thus enables a distinction between the actual measurement signal and influences of the environment.

Figure 7:
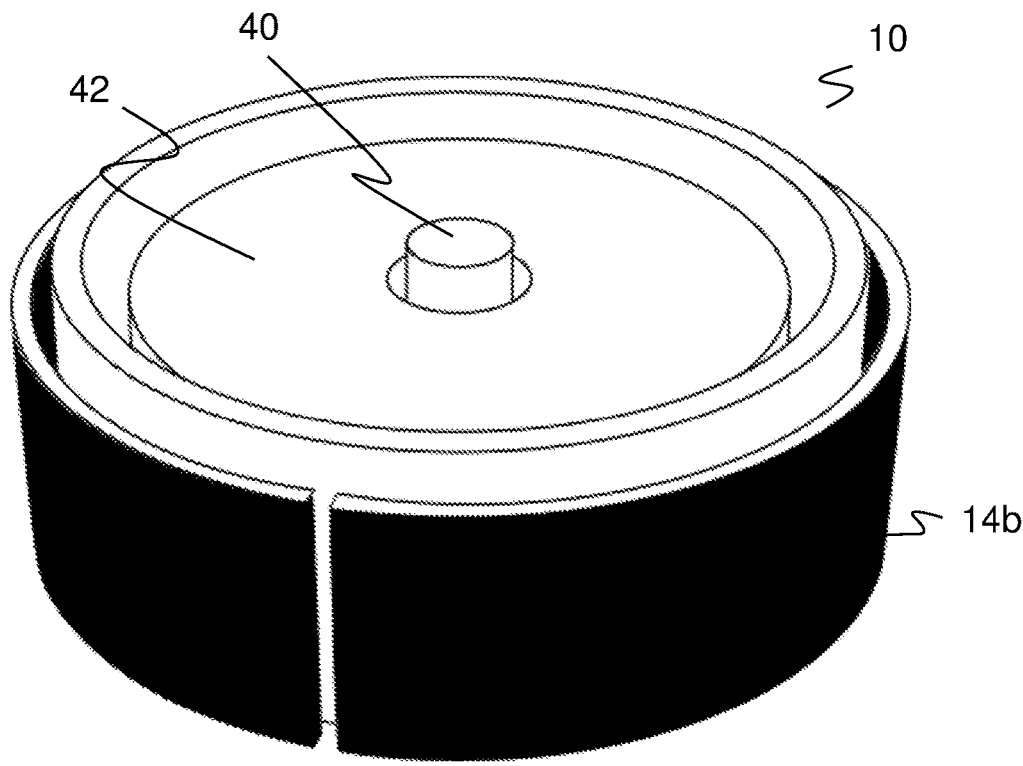
FIG. 7 a three-dimensional view of an engaged short circuit ring for an improved detection of the sensor environment.

FIG. 7 shows a three-dimensional view with a further alternative in the form of a switchable short circuit ring 14b. The short circuit ring 14b is not a coil, but satisfies a very similar function to the additional coil 14. If the short circuit ring 14b is alternatingly engaged in the measurement, the magnetic field in the environment of the installation of the sensor 10 is thereby varied between two measurements.

Figure 8:
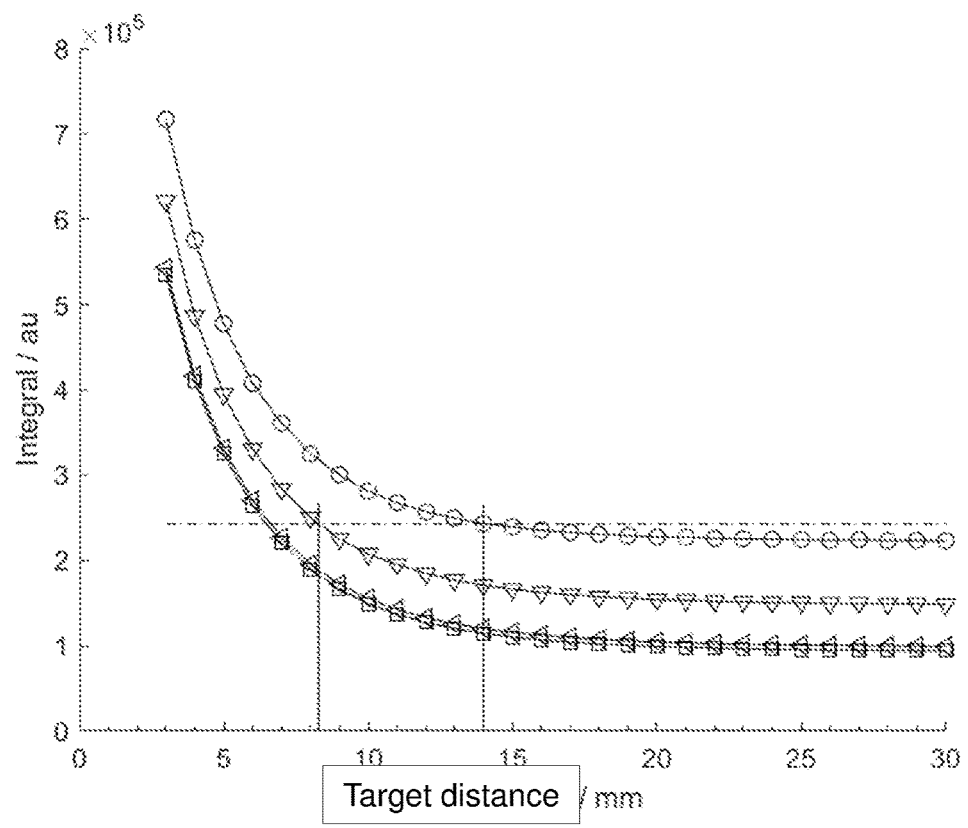
FIG. 8 a representation of exemplary uncorrected characteristics of an inductive sensor at different installation depths.

The training and the later application of the correction in accordance with the invention by a method of machine learning will now be illustrated for exemplary data with respect to FIGS. 8 to 12. FIG. 8 first shows uncorrected characteristics of the sensor 10 for comparison when, that is, the uncorrected integral is simply used as the basis of the classical signal evaluation. The characteristics are determined for different installation depths and are respectively shown by different symbols of the data points. The dashed horizontal line corresponds to the switching threshold. A factory comparison took place at a defined installation depth and at a switching distance of 14 mm corresponding to the right hand perpendicular line. If, however, the sensor 10 is then operated at a greater installation depth, the switching distance is reduced in this example to only 8.2 mm corresponding to the left hand perpendicular line. Without the correction in accordance with the invention, the sensor 10 is consequently anything but independent of its installation situation.

Figure 9:
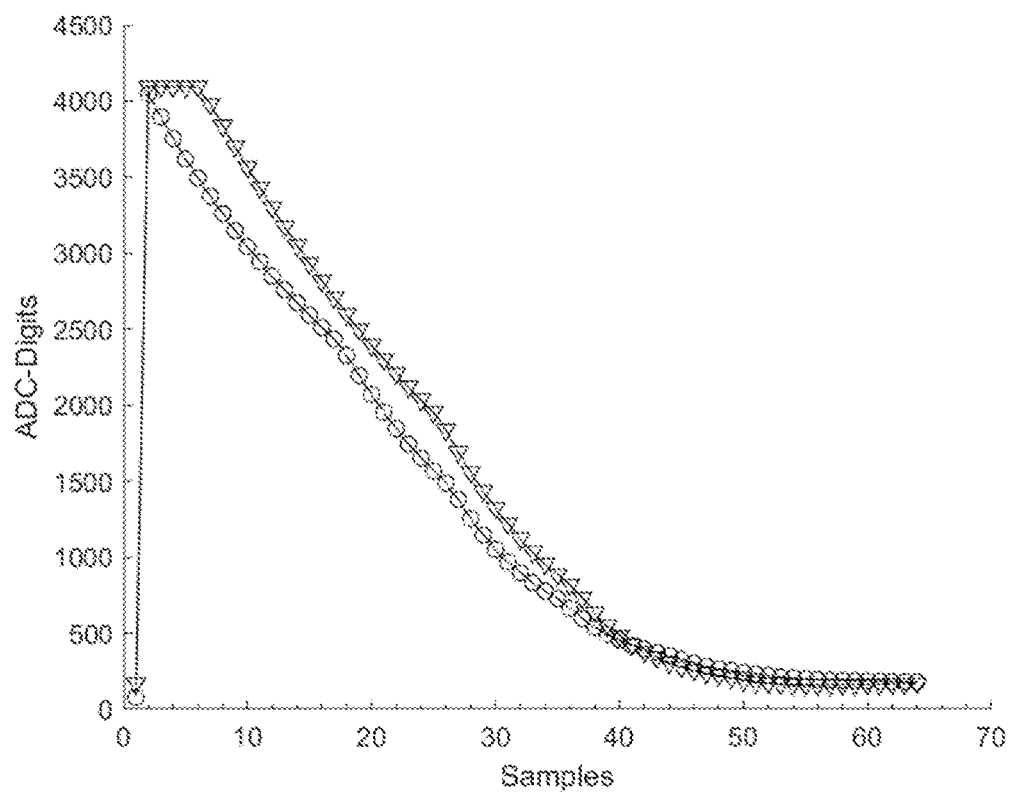
FIG. 9 exemplary representations of the pulse responses to a transmission coil and an additional coil.

Training data are produced for the training of the method of machine learning. In accordance with the invention, the training does not have to be carried out individually for every sensor 10 but one sensor of a construction shape or a class of sensors can be trained as representative. It is conceivable here to train with a plurality of sensors and thus to better cover the tolerances to be expected. The sensor is moved into different installation situations and detection situations for detecting the training data. The installation materials, the installation depth, and the material and the distance of the object or target to be detected are varied for this purpose. The more possible situations that are covered and the finer the increment for the installation depth and the distance, the more accurately the training data become, but at the same time the data volume and thus the effort for the training and for the determination of the model for the method of machine learning is increased. A pulse response to a pulse of the transmission and reception coil 12 and the additional coil 14 is respectively recorded. An example is shown in FIG. 9 with circles for the actual sensor signal and with triangles for the additional signal. It is conceivable to simultaneously provide a plurality of training situations in that a target pass is simultaneously measured by a plurality of sensors, for example at different installation depths or of different installation materials.

The reference signal required in the optional step S3 of FIG. 4 can also be recorded as part of the detecting of training data. The reference signal is preferably based on a fixed detection situation, for instance a maximum target distance and a maximum installation depth with a specific installation material and target material. The reference signal can be respectively recorded for the pulse response of the transmission and reception coil 12 and of the additional coil 14 and can be deducted from the respective sensor signal or additional signal in step S3.

Figure 10:
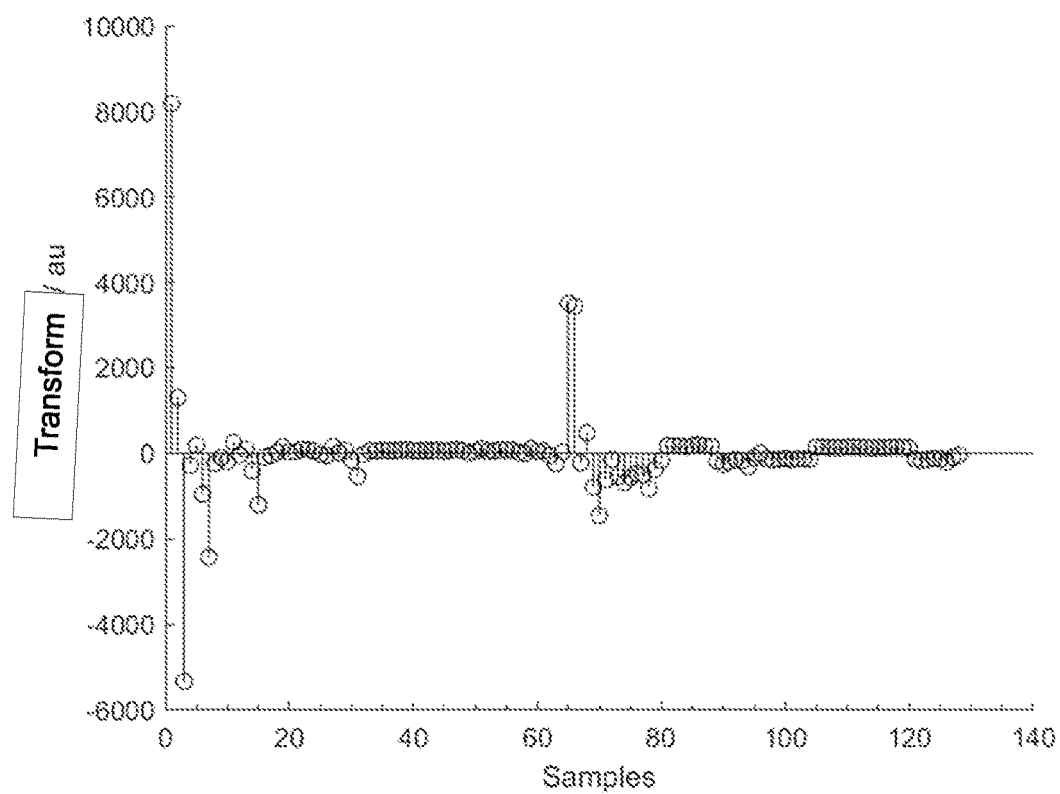
FIG. 10 a representation of a transform for the pulse responses in accordance with FIG. 9.

The pulse responses that are shown by way of example in FIG. 9 and that have preferably respectively been corrected by the associated reference signal are now subjected to a transformation, with the examples of suitable transformations having been named above. A transform is shown in FIG. 10. No distinction is made in FIG. 10 between a sensor signal and an additional signal; transformation and the combination to a vector is preferably respectively carried out separately.

Figure 11:
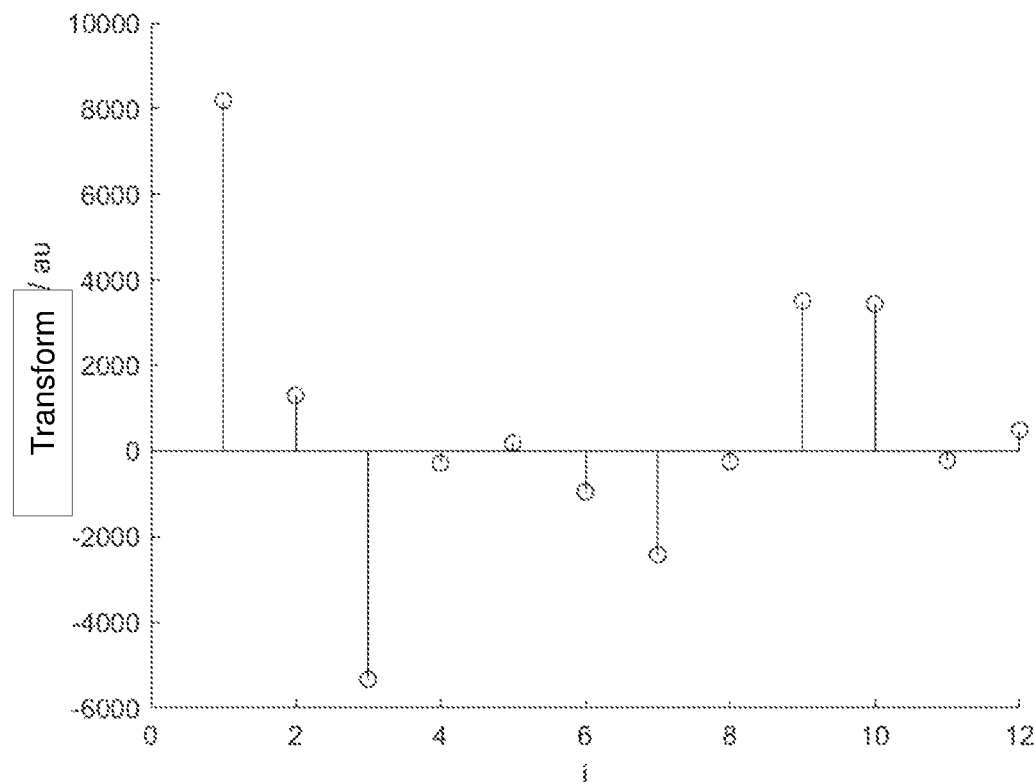
FIG. 11 a representation of an exemplary feature vector acquired from the transform in accordance with FIG. 10.

FIG. 11 illustrates a feature vector extracted from the transform. The transforms are advantageously selected with the greatest variation over all the training data to form the feature vector therefrom. Only the values are now selected for the dimension reduction or data reduction as features for a model whose variation over the total data set exceeds a defined threshold. The feature vector in accordance with FIG. 11 here contains much fewer elements than the transform in accordance with FIG. 10.

Each feature vector acquired from the training data in this manner has a desired correction value Y associated with it that corresponds to the desired correction value in this detection and installation situation. Annotated or labeled training data for a monitored learning are accordingly produced. Any method of machine learning can thus be trained in principle of which some were listed above. The trained coefficients or weights offset against the feature vector of a respective new measurement in operation to obtain the sought correction value that is then, for example, added to or deducted from an integral value of a classical signal evaluation. A respective separate model per construction shape or class of the sensor 10 is preferably prepared and trained.

Figure 12:
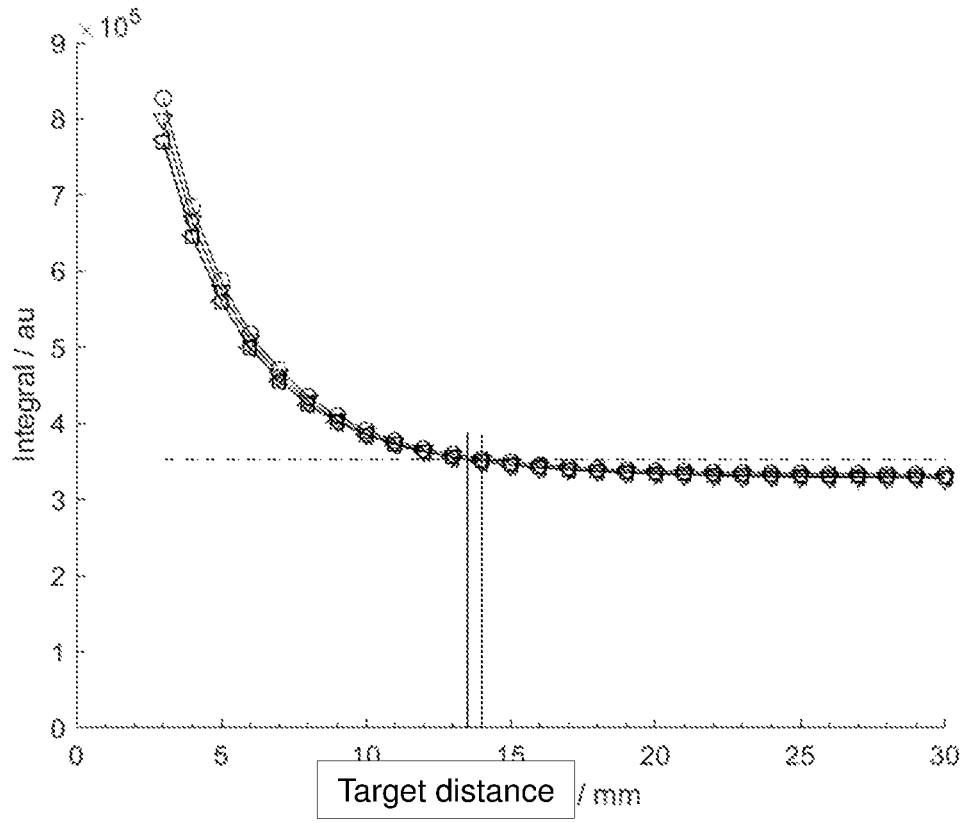
FIG. 12 a representation similar to FIG. 9 of the now corrected characteristics of an inductive sensor at different installation depths.

FIG. 12 shows in a representation similar to FIG. 8 the characteristics of a sensor 10 that has been corrected using the method of machine learning after completion of the training. The two perpendicular liens for the switching distance on the factory adjustment to 14 mm and with an installation depth changed with respect to the factory adjustment are now almost over one another; the switching point is at 13.5 mm and has hardly been displaced thanks to the correction in accordance with the invention.

In summary, the idea of the invention comprises not using a method of machine learning along and by no means as in the prior art on the basis of the raw sensor signals. The machine learning rather supplements a conventional signal evaluation, with the machine learning being responsible for detecting the interfering sensor environment and the correction value that can be determined therefrom. The basic functionality of the sensor in accordance with the invention also does not solely depend on the machine learning thanks to this division. The correction value can be detected in slower cycles and thereby with fewer processor resources. No sensor-individual training is required and tolerance between individual sensors of a class can be compensated by reference signals. The effort for this is incomparably much lower than all the detection situations having to be covered specifically for every single sensor.

The invention claimed is:

1. A sensor for detecting an object, comprising:
a detection unit for detecting a sensor signal and a control and evaluation unit that is configured to determine an object property by evaluating the sensor signal; and
a correction value unit,
wherein the control and evaluation unit is further configured to determine a correction value for interference of the sensor environment from the sensor signal by further evaluation using a method of machine learning and to take the correction value into account in the determination of the object property.

2. The sensor in accordance with claim 1, wherein the sensor is an inductive proximity sensor.

3. The sensor in accordance with claim 1, wherein the detection unit has at least one coil.

4. The sensor in accordance with claim 1, that has at least one coil for generating a pulse signal.

5. The sensor in accordance with claim 1, that has an additional element to vary properties of the detection unit or of a generated pulse signal and thus to detect additional information on the sensor environment.

6. The sensor in accordance with claim 5, wherein the additional element is a vertical coil, a coaxial coil, or a short circuit ring.

7. The sensor in accordance with claim 1, wherein the control and evaluation unit is configured to determine a binary object determination signal as an as the object property.

8. The sensor in accordance with claim 7, wherein the sensor has a switching output to output the object determination signal as a switching signal.

9. The sensor in accordance with claim 1, wherein an A/D converter is associated with the detection unit for digitizing the sensor signal.

10. The sensor in accordance with claim 1, wherein the control and evaluation unit is configured to generate an intermediate signal from a reference signal and the sensor signal and to determine the object property and/or the correction value with reference to the intermediate signal.

11. The sensor in accordance with claim 10, wherein the reference signal is a previously recorded and stored separate sensor signal of the sensor or a representation of a sensor signal.

12. The sensor in accordance with claim 1, wherein the control and evaluation unit is configured to generate a feature vector from the sensor signal.

13. The sensor in accordance with claim 1, wherein the control and evaluation unit is configured to generate a feature vector from the sensor signal after a transformation and/or dimension reduction.

14. The sensor in accordance with claim 1, wherein the control and evaluation unit is configured to integrate the sensor signal.

15. The sensor in accordance with claim 1, wherein the control and evaluation unit is configured to integrate the sensor signal to compare the integrated sensor signal with a threshold value.

16. The sensor in accordance with claim 15, wherein the correction value is a correction value for the integrated sensor signal.

17. The sensor in accordance with claim 1, wherein the control and evaluation unit is configured for at least one of the following methods of machine learning: a linear model, a decision tree, a neural network, a Gaussian process regression, a k-nearest neighbor process, or a support vector machine.

18. The sensor in accordance with claim 1, wherein the method of machine learning is trained using sensor signals in different sensor environments.

19. The sensor in accordance with claim 1, wherein the method of machine learning is trained using sensor signals in different sensor environments while varying the installation depth, installation material, object distance, and object material.

20. The sensor in accordance with claim 1, wherein the control and evaluation unit is configured to track the correction value over time and to adapt it with reference to its history.

21. The sensor in accordance with claim 1, wherein the control and evaluation unit is configured to track the correction value over time and to adapt it with reference to its history with a prediction filter.

22. A method of evaluating a sensor signal of a sensor of an inductive proximity sensor, wherein the sensor signal is detected and evaluated to determine an object property,
wherein a correction value for interference of the sensor environment is determined from the sensor signal in a further evaluation using a method of machine learning and the correction value is taken into account in the determination of the object property.

23. The method in accordance with claim 22, wherein the sensor signal is provided by an inductive proximity sensor.

24. The method in accordance with claim 22, wherein the method of machine learning is trained in advance using sensor signals in different sensor environments.

25. The method in accordance with claim 22, wherein the method of machine learning is trained in advance using sensor signals in different sensor environments while varying the installation depth, installation material, object distance, and object material.

26. A sensor for detecting an object, comprising:
a detection unit for detecting a sensor signal and a control and evaluation unit that is configured to determine an object property by evaluating the sensor signal; and
a correction value unit,
wherein the control and evaluation unit is further configured to determine a correction value for interference of the sensor environment from the sensor signal by classical signal evaluation, and correcting the classical signal evaluation, and providing further evaluation using a method of machine learning and to take the correction value into account in the determination of the object property.

* * * * *

UNITED STATES PATENT AND TRADEMARK OFFICE
CERTIFICATE OF CORRECTION

PATENT NO. : 12,007,229 B2
APPLICATION NO. : 17/470598
DATED : June 11, 2024
INVENTOR(S) : Andreas Peter, Sascha Thoss and Olaf Machul It is certified that error appears in the above-identified patent and that said Letters Patent is hereby corrected as shown below:

In the Claims

Claim 7, Column 11, Line 40, please delete the phrase "as an".

Signed and Sealed this
Tenth Day of December, 2024

Katherine Kelly Vidal
*Director of the United States Patent and Trademark Office*